United States Patent [19]

Blank

[11] 4,002,803

[45] Jan. 11, 1977

[54] MAGNETIC BUBBLE DEVICES WITH CONTROLLED TEMPERATURE CHARACTERISTICS

[75] Inventor: Stuart Lawrence Blank, Madison, N.J.

[73] Assignee: Bell Telephone Laboratories, Incorporated, Murray Hill, N.J.

[22] Filed: Aug. 25, 1975

[21] Appl. No.: 607,379

[52] U.S. Cl. .............................. 428/539; 252/62.57; 252/62.59; 252/62.63; 340/174 TF; 428/900

[51] Int. Cl.² ..................... G11C 11/14; G11B 5/00

[58] Field of Search ........... 340/174 TF; 252/62.57, 252/62.59, 62.63; 428/539, 900

[56] References Cited

UNITED STATES PATENTS

| | | | |
|---|---|---|---|
| 3,460,116 | 8/1969 | Bobeck et al. | 340/174 TF |
| 3,534,346 | 10/1970 | Bobeck | 340/174 TF |
| 3,541,534 | 11/1970 | Bobeck et al. | 340/174 TF |
| 3,633,185 | 1/1972 | Danylchuk | 340/174 TF |
| 3,643,238 | 2/1972 | Bobeck et al. | 252/62.57 X |
| 3,646,529 | 2/1972 | Bobeck et al. | 252/62.57 X |
| 3,665,427 | 5/1972 | Bobeck et al. | 252/62.57 X |
| 3,673,582 | 6/1972 | Clover | 340/174 TF |
| 3,792,452 | 2/1974 | Dixon et al. | 252/62.57 X |
| 3,845,477 | 10/1974 | Le Craw et al. | 252/62.57 X |
| 3,886,533 | 5/1975 | Bonner et al. | 252/62.57 X |
| 3,947,372 | 3/1976 | Shinagawa et al. | 252/62.59 X |
| 3,949,386 | 4/1976 | Klokholm et al. | 252/62.57 X |

*Primary Examiner*—Harold Ansher
*Attorney, Agent, or Firm*—Allen N. Friedman

[57] ABSTRACT

The temperature variation of the bubble collapse field of a class of garnet magnetic bubble layer materials is selected by control of octahedral site substitution during layer growth. This permits the growth of layers, whose temperature dependence of critical magnetic properties more closely matches the temperature dependence of available bias magnet materials, resulting in extended operating temperature range and/or wider operating margins (with attendant improvement in manufacturing yield). A preferred substitution species is lutetium, known as a dodecahedral site occupant, for which it has been determined that a significant and controllable octahedral occupancy can be produced by suitable choice of growth conditions.

8 Claims, 4 Drawing Figures

MAGNETIC BUBBLE DEVICES WITH CONTROLLED TEMPERATURE CHARACTERISTICS

BACKGROUND OF THE INVENTION

1. Field of the Invention

The invention is concerned with magnetic "bubble" devices. In particular, the invention is concerned with devices which include a supported layer of magnetic garnet material, generally, but not necessarily, on a non-magnetic garnet substrate. Such devices depend for their operation on nucleation and/or propagation of small enclosed magnetic domains of polarization opposite to that of the immediately surrounding material in the supported layer. These domains have come to be known as "magnetic bubbles." Functions which may be performed include switching, memory and logic.

2. Description of the Prior Art

A magnetic bubble is a magnetic domain characterized by a single domain wall which closes upon itsef in the plane of a layer of magnetic material in which it can be moved. Inasmuch as the wall closes on itself, the domain is self-defined and is free to move anywhere in the plane. Domains of this type are disclosed in U.S. Pat. No. 3,460,116 of a A. H. Bobeck et al. issued Aug. 5, 1969.

A layer of magnetic material in which bubbles can be moved typically includes an epitaxially grown single crystal film having a preferred direction of magnetization normal to the plane of the film. A domain in such a material is visualized as a right circular cylinder magnetically positive at the top surface of the layer and negative at the bottom forming a magnetic dipole along an axis normal to the plane of movement. When exposed to polarized light and viewed through an analyzer, a single wall domain appears as a disk relatively dark or light, in contrast to the remainder of the layer (thus, the term magnetic bubble).

When a suitable layer of magnetic material is maintained in a bias field perpendicular to the layer, a bubble is stable over a range of bias fields, which corresponds to a (stability) range of diameters. This range of diameters varies from a maximum at which a bubble "strips out" (at low bias field) to a finite minimum at which the bubble collapses, (at high bias field) a range in which the maximum and minimum diameters differ by a factor of about three. The upper end of the corresponding bias field range is termed the "bubble collapse field" and the lower end of the range is termed the "strip out field". To ensure the widest possible operating margins in a practical bubble device, a bias field is typically chosen to produce a characteristic diameter in the middle of a bias range, which corresponds to the stability range of diameters.

In much of the literature, it has been prescribed by those skilled in the art that a layer of material suitable for the movement of single wall domains be characterized by properties which ensure a stability range of magnetic field which is ideally constant as a function of temperature over a practical temperature range and that the bias field be maintained at a preselected constant value. Inasmuch as the stability range of a layer of selected material varied, the operating margins were reduced. The properties of magnetic materials and the relationship of those properties to the stability range are discussed in the *Bell System Technical Journal*, Vol. 50, No. 3, March, 1971, at page 725 et seq., in an article by A. A. Thiele, entitled "Device Implications of the Theory of Cylindrical Magnetic Domains."

A modification of this device design concept, which has lead to extended operating temperature ranges is disclosed in U.S. Pat. NO. 3,711,841, issued Jan. 16, 1973. This patent discloses the utility of temperature varying materials, if a bias magnet structure is used which produces a temperature varying bias field to approximately match the temperature variation of the material. However, to extend the range of utility of bubble devices it would be desirable to tailor the bubble material properties to better match the temperature variation of available and otherwise desirable bias magnet materials.

SUMMARY OF THE INVENTION

A critically defined class of eminently useful substituted iron garnet bubble materials has been found, in which the temperature variation of bubble collapse field can be sensitively adjusted during growth, to closely match the temperature variation of available bias magnet materials. This close match has been made possible by the determination that a class of rare earth materials, which are known and used as dodecahedral site occupants, can be made to possess a significant and controllable octahedral site occupancy by suitable choice of growth conditions. This control of octahedral site occupancy results in a control of the temperature variation of bubble collapse field without the introduction of additional species with attendant added complexity of the growth melt. This has resulted in the fabrication of magnetic bubble devices, operable over extended temperature ranges (e.g., 0° to 100 ° C). If operation over this extended temperature range is not necessary, the broadened operating margins of these devices can be used to increase manufacturing yield.

The inventive materials are flux grown substituted iron garnets with predominantly growth induced anisotropy. These materials can be represented by the atomic formula:

$$(R1)_{3-(a+b)}(R2)_{a+c}(Ca,Sr)_b(Ge,Si)_bFe_{5-(b+c)}O_{12};$$

where (R1) is at least one member of the group consisting of Y, Gd, Sm or Eu and (R2) is Lu, Yb or Tm. In this formula, the amount of octahedral site substitution of the (R2) group is represented by the subscript *c*.

In this formula, the (R2) materials constitute the class used in the invention for control of temperature variation of bubble collapse field. As dodecahedral site occupants, they are useful in the selection of material properties such as magnetic anisotropy and lattice constant. The production of controlled octahedral site occupancy of these materials constitutes a new dimension to their use. Among the (R2) materials, lutetium is a preferred embodiment because of its relatively smaller ion size.

DETAILED DESCRIPTION OF THE INVENTION

1. Bubble Devices

Figure 1:
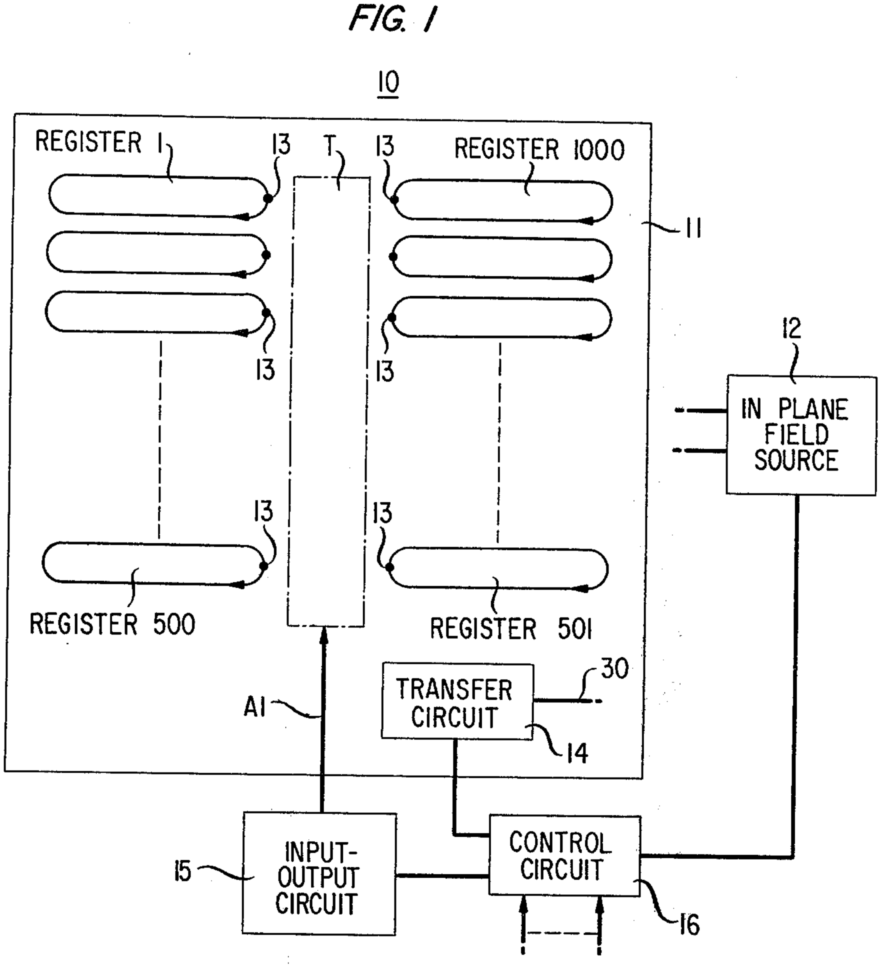
FIG. 1 is a schematic diagram of a recirculating memory in accordance with the invention.
Figure 2:
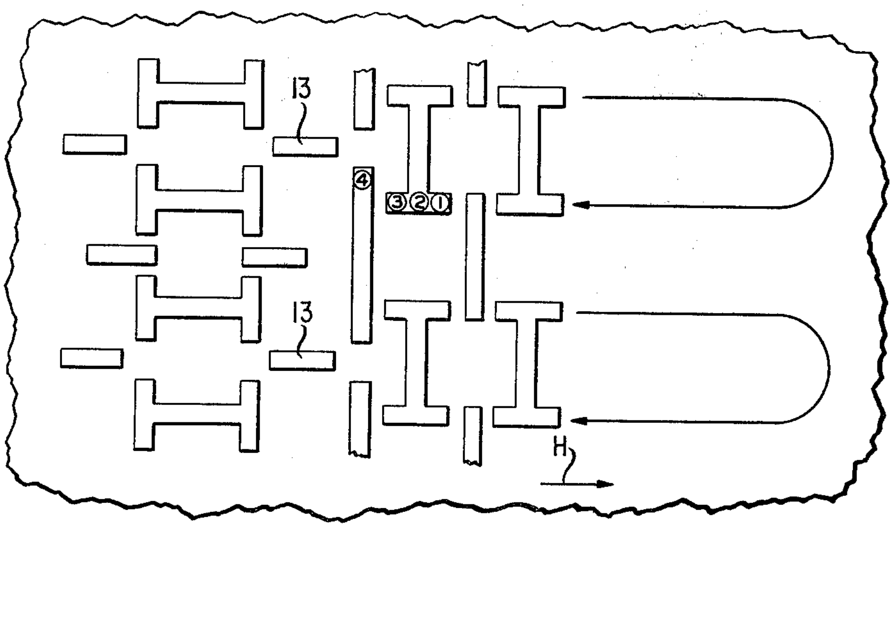
FIG. 2 is a detailed magnetic overlay for portions of the memory of FIG. 1 showing domain locations during operation.

The device of FIGS. 1 and 2 is illustrative of the class of "bubble" devices described in *IEEE Transactions on Magnetics*, Vol. *MAG*-5, No, 3, September 1969, pp. 544–553, in which switching, memory and logic functions depend upon the nucleation and propagation of enclosed, generally cylindrically shaped, magnetic domains having a polarization opposite to that of the immediately surrounding area (magnetic bubbles). Interest in such devices centers, in large part, on the very high packing density so afforded, and it is expected that commercial devices with from $10^5$ and $10^7$ bit positions per square inch will be commercially available. The device of FIGS. 1 and 2 represents a somewhat advanced stage of development of the bubble devices and includes some details which have been utilized in recently operated devices.

FIG. 1 shows an arrangement 10 including a layer 11 of material in which single wall domains can be moved. The movement of domains, in accordance with this invention, is dictated by patterns of magnetically soft overlay material in response to reorienting in-plane fields. For purposes of description, the overlays are bar and T-shaped segments and the reorienting in-plane field rotates clockwise in the plane of sheet 11 as viewed in FIGS. 1 and 2. The reorienting field source is represented by a block 12 in FIG. 1 and may comprise mutually orthogonal coil pairs (not shown) driven in quadrature, as is well understood. The overlay configuration is not shown in detail in FIG. 1. Rather, only closed "information" loops are shown in order to permit a simplified explanation of the basic organization in accordance with this invention unencumbered by the details of the implementation. We will return to an explanation of the implementation hereinafter.

The figure shows a number of horizontal closed loops separated into right and left banks by a vertical closed loop as viewed. It is helpful to visualize information, i.e., domain patterns, circulating clockwise in each loop as an in-plane field rotates clockwise.

The movement of domain patterns simultaneously in all the registers represented by loops in FIG. 1 is synchronized by the in-plane field. To be specific, attention is directed to a location identified by the numeral 13 for each register in FIG. 1. Each rotation of the in-plane field advances a next consecutive bit (presence or absence of a domain) to that location in each register. Also, the movement of bits in the vertical channel is synchronized with this movement.

In normal operation, the horizontal channels are occupied by domain patterns and the vertical channel is unoccupied. A binary word comprises a domain pattern which occupies simultaneously all the positions 13 in one or both banks, depending on the specific organization, at a given instance. It may be appreciated that a binary word so represented is fortunately situated for transfer into the vertical loop.

Transfer of a domain pattern to the vertical loop, of course, is precisely the function carried out initially for either a read or a write operation. The fact that information is always moving in a synchronized fashion permits parallel transfer of a selected word to the vertical channel by the simple expedient of tracking the number of rotations of the in-plane field and accomplishing parallel transfer of the selected word during the proper rotation.

The locus of the transfer function is indicated in FIG. 1 by the broken loop T encompassing the vertical channel. The operation results in the transfer of a domain pattern from (one or) both banks of registers into the vertical channel. A specific example of an information transfer of a one thousand bit word necessitates transfer from both banks. Transfer is under the control of a transfer circuit represented by block 14 in FIG. 1. The transfer circuit may be taken to include a shift register tracking circuit for controlling the transfer of a selected word from memory. The shift register, of course, may be defined in material 11.

Once transferred, information moves in the vertical channel to a read-write position represented by vertical arrow A1 connected to a read-write circuit represented by block 15 in FIG. 1. This movement occurs in response to consecutive rotations of the in-plane field synchronously with the clockwise movement of information in the parallel channels. A read or write operation is responsive to signals under the control of control circuit 16 of FIG. 1 and is discussed in some detail below.

The termination of either a write or a read operation similarly terminates in the transfer of a pattern of domains to the horizontal channel. Either operation necessitates the recirculation of information in the vertical loop to positions (13) where a transfer operation moves the pattern from the vertical channel back into appropriate horizontal channels as described above. Once again, the information movement is always synchronized by the rotating field so that when transfer is carried out appropriate vacancies are available in the horizontal channels at positions 13 of FIG. 1 to accept information. For simplicity, the movement of only a single domain, representing a binary one, from a horizontal channel into the vertical channel is illustrated. The operation for all the channels is the same as is the movement of the absence of a domain representing a binary zero. FIG. 2 shows a portion of an overlay pattern defining a representative horizontal channel in which a domain is moved. In particular, the location 13 at which domain transfer occurs is noted.

The overlay pattern can be seen to contain repetitive segments. When the field is aligned with the long dimension of an overlay segment, it induces poles in the end portions of that segment. We will assume that the field is initially in an orientaion as indicated by the arrow H in FIG. 2 and that positive poles attract domains. One cycle of the field may be thought of as comprising four phases and can be seen to move a domain consecutively to the positions designated by the encircled numerals 1, 2, 3, and 4 in FIG. 2, these positions being occupied by positive poles consecutively as the rotating field comes into alignment therewith. Of course, domain patterns in the channels correspond to the repeat pattern of the overlay. That is to say, next adjacent bits are spaced one repeat pattern apart. Entire domain patterns representing consecutive binary words, accordingly, move consecutively to positions 13.

The particular starting position of FIG. 2 was chosen to avoid a description of normal domain propagation in response to rotating in-plane fields (considered unnecessary to this description). The consecutive positions from the right as viewed in FIG. 2 for a domain adjacent the vertical channel preparatory to a transfer operation are described. A domain in position 4 of FIG. 2 is ready to begin its transfer cycle.

2. Composition

Garnets suitable for the practice of the invention are of the general stoichiometry of the prototypical compound $Y_3Fe_5O_{12}$. This is the classical yttrium iron garnet (YIG) which, in its unaltered form, is ferrimagnetic with net room temperature magnetic moment of ~1750 gauss being due to the predominance of one iron ion per formula unit in the tetrahedral sites over iron ions in the octahedral sites. In this prototypical compound, yttrium occupies a dodecahedral site. The site names are chosen with respect to the geometric arrangement of nearest neighbor oxygen atoms surrounding the ion in the site (i.e., an octahedral site has six nearest neighbor oxygens forming an octahedron). The primary composition requirement, in accordance with the invention, is concerned with the nature of the ions, in part replacing iron in the octahedral sites, to control (i.e., preselect) the rate of change of the bubble collapse field with temperature. There is, of course, an attendant change in strip out field. These two fields determine the operating margin of the device. The difference between these two bias field values tends to remain constant with temperature. The higher valued quantity, bubble collapse field, is easily determined and has been chosen as the characteristic quantity for the purpose of describing the invention.

The preferred compositions for operation of the invention can be represented by the formula:

$$(R1)_{3-(a+b)}(R2)_{a+c}(Ca,Sr)_b(Ge,Si)_bFe_{5-(b+c)} \quad (1.)$$

where (R1) is at least one member of the group consisting of yttrium (Y), gadolinium (Gd), samarium (Sm), or europium (Eu) and (R2) is lutetium (Lu), ytterbium (Yb) or thulium (Tm). In these compositions germanium and/or silicon is included as a tetrahedral site substitution included to reduce the total magnetic moment of the garnet to the desired range (e.g., approximately 200 gauss) in order to achieve the desired characteristic bubble size (~5$\mu$ meters). In the prototype compound (YIG) all of the anions are triply ionized, however, germanium and silicon are quadruply ionized, therefore an equal amount of a divalent ion must be included for charge neutrality (valence balancing).

The general formula is expressed in terms of calcium or strontium as the divalent ion required for valence balancing of the tetravalent ion. Calcium is the most prevalent ion used for this purpose, and it is quite likely that compositions of the invention will utilize it alone for valence balancing. However, there are a number of other divalent or even monovalent ions that can also be utilized for valence balancing in whole or in part. For example, strontium, of somewhat larger ionic diameter than calcium, may be utilized in lieu of up to at least 50 percent of the calcium present. As with other variations in the formula, a general purpose for such replacement is to adjust the lattice parameter to more precisely match with respect to the substrate within tolerance limits.

The prototype garnet materials possess cubic symmetry, thus are ideally isotropic in magnetic properties. However, it is known that garnet materials may be made to deviate from their classic isotropic characteristics by either one or by a combination of two mechanisms. The uniaxial anisotropy, perpendicular to the garnet layer, required to support magnetic bubble domains, can be produced by a strain induced mechanism or a growth induced mechanism. In the strain induced mechanism the bubble garnet layer is maintained under strain by a lattice mismatch between the layer and substrate. This strain produces a uniaxial magnetostriction effect. The growth induced anisotropy results from the preferential occupation of certain paramagnetic ions in certain of the dodechahedral sites during layer growth. In the compositions of the invention the growth induced anisotropy is the predominant effect. This is mainly because the operation of the invention depends upon the sensitive control of the temperature variation of magnetic properties. Since strain induced anisotropy tends to be quite sensitive to temperature because of thermal expansion effects, octahedral site substitution is, in most cases, relatively less effective in the control of the temperature variation of magnetic properties in garnets in which the strain induced mechanism predominates.

In Equation 1 (R1) and $(R2)_a$ represent the dodechadral site species which contribute to the magnetic properties of the garnet (i.e., aside from $(Ca,Sr)_b$ required for valence balancing). These are selected from the broad class of yttrium and the rare earth elements of the lanthanide series between atomic numbers 57 and 71 of the Periodic Table of the Elements. The selection of these species and their proportions are selected in accordance with principles well known in the art in order to achieve a number of desired magnetic properties in the layer with respect to contemplated device use (See, for example, J. W. Nielsen et al. *J. of Electronic Materials*, 3 (1974) 693). These several material constraints include production of the desired degree of growth induced anisotropy, the desired lattice parameter, the desired total magnetic moment, the desired bubble mobility, and the requirement for valence balancing of the total composition.

Another property that is critical to the practical application of bubble devices is the bubble collapse field. For operation of bubble devices the bias field, desirably maintained by a permanent magnet structure, must maintain a closely controlled relationship with the bubble collapse field of the garnet material over the temperature range of operation of the device. Thus the relationship between the temperature variation of the bubble collapse field and the temperature variation of the permanent magnetic material is of primary importance in determining the operating temperature range of the magnetic bubble devices. It has been suggested (U.S. Pat. No. 3,711,841, issued Jan. 16, 1973) that the temperature range of operation of bubble devices can be broadened by using a bias magnet whose temperature variation of field approximately matches the temperature variation of bubble collapse field of the garnet material used. The herein disclosed invention relates to the extension of this idea by the sensitive adjustment of the temperature variation of bubble collapse field ($\Delta H_o$) of certain magnetic garnets by control of the octahedral substitution of certain ionic species in these garnets to the extent of from 0.01 to 0.2 moles per formula unit. Substitutions below 0.01 do not, in most cases, result in technologically significant temperature rate control. Substitutions above 0.2 are difficult to achieve while maintaining other necessary device characteristics.

The above disclosed sensitive control of the temperature variation of bubble collapse field to more closely match the temperature variation of available and otherwise technologically desirable permanent magnet materials has permitted the development of magnetic bubble devices intended for operation over even broader temperature ranges (e.g., 0° C to 100° C). If operation of such temperature ranges is not necessary, use of the invention is still desirable because of an attendant broadening of operating margins. This broadening of operating margins can result in increased manufacturing yield of devices intended for use in more closely temperature controlled operating environments.

It has been found that, in the specified class of garnet materials, the rate of change of bubble collapse field with temperature can be varied by octahedral site substitution during layer growth. In addition, a novel class of octahedral substitution species has been found. The members of this class, lutetium, ytterbium, and thulium are rare earth species in the lanthanide series. Their ion size makes them predominantly dodecahedral site occupants. (Dodecahedral sites are the largest sites in the garnet lattice.) They are known and used as such, in the control of such critical properties as uniaxial anisotropy, lattice parameter, and bubble mobility. Suitable selection of growth conditions, however, produces significant and variable octahedral substitution of these materials.

Figure 3:
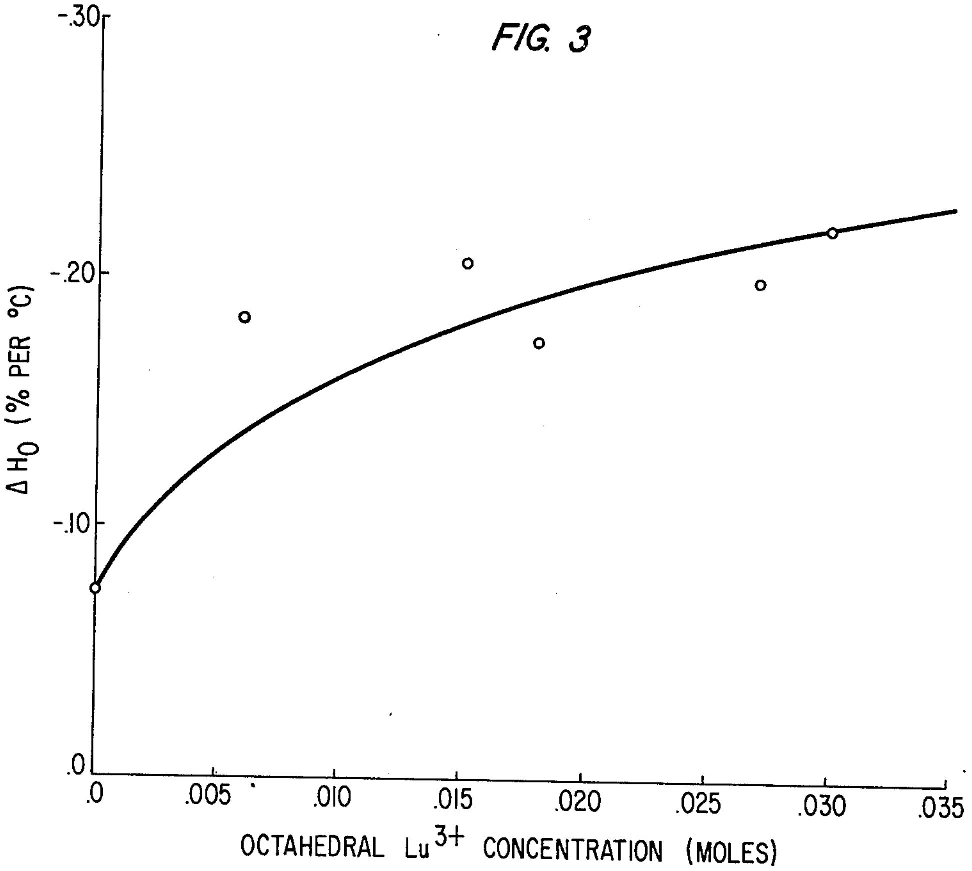
FIG. 3 is a plot of temperature variation of bubble collapse field (ordinate) as a function of the amount of octahedrally substituted lutetium (abscissa) for exemplary compositions of the invention.

FIG. 3 shows a plot of the rate of change of bubble collapse field with temperature as a function of the molar concentration of octahedrally substituted lutetium (subscript *c*) in garnet layers of approximate composition $Y_{1.3}Sm_{.26}Lu_{.44}CaGeFe_4O_{12}$.

The amount of octahedral site substitution of these materials is denoted in Equation 1 by $(R2)_c$. In Equation 1 the amount of octahedrally substituted (R2) is compositionally differentiated from the amount of dodecahedrally substituted (R2) by the fact that the dodecahedral portion subscript, *a*, is subtracted from the (R1) component whereas the octahedral portion subscript, *c*, is substracted from the Fe component.

It is considered that the ability to place the (R2) group ions (i.e., $Lu^{3+}$, $Yb^{3+}$, and $Tm^{3+}$) on octahedral sites is related to the size of these ions. These are the three smallest members of the lanthanide series, with $Lu^{3+}$ being smallest and $Tm^{3+}$ being largest of the three. It is considered that, for this reason, lutetium has the largest and most widely controllable octahedral substitution. Thus of these three species it is most useful in selection of the temperature variation of bubble collapse field. It is the most highly preferred species for use in the practice of the invention, as presently contemplated. However, other considerations (e.g., lattice match, bubble mobility, uniaxial anisotropy) may dictate the use of Yb or Tm as all or part of the (R2) portion. It is the particular advantage of the use of the (R2) group, that a portion of the included (R2) ions can be controllably placed on octahedral sites, in order to preselect the temperature response of the material, while the major portion is being used to control other critical material parameters. The possible use of predominantly octahedral site substituents in this context would only tend to add complexity to the already complex thermodynamics of the growth melt.

Figure 4:
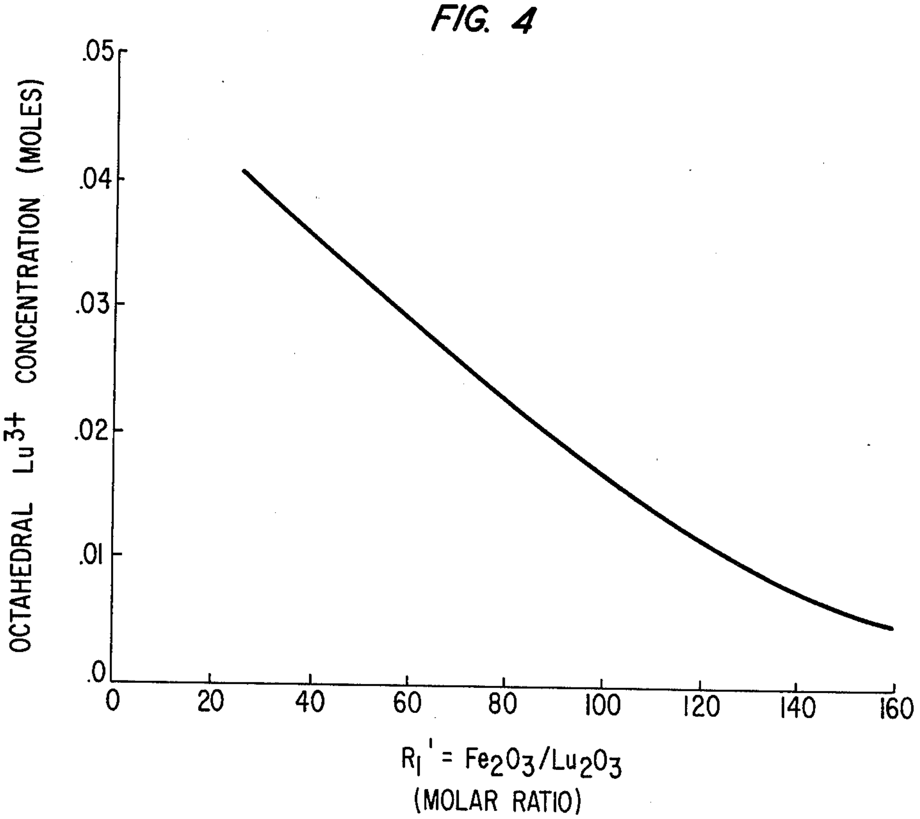
FIG. 4 is a plot of octahedrally substituted lutetium (ordinate) as a function of $R_1'$ (i.e., $Fe_2O_3/Lu_2O_3$) in the growth melt for exemplary compositions of the invention.

The degree of octahedral substitution of (R2) species can be selected by the selection of the ratio of iron oxide to (R2) oxide in the melt ($R_1'$) while keeping the ratio of iron oxide to the sum of all rare earth oxides ($R_1$) within the garnet phase field. FIG. 4 shows a plot of octahedrally substituted lutetium in a garnet layer of approximate composition $Y_{1.3}Sm_{.26}Lu_{.44}CaGeFe_4O_{12}$ as a function of the molar ratio $R_1' = Fe_2O_3/Lu_2O_3$ in the growth melt.

3. Growth

Discussion has been in terms of supported films of the concerned compositions; and present and contemplated devices, at least in the bubble memory category, are dependent on this structure. Nevertheless these and other devices may utilize this self-supported sheets of bulk material which may conceivably be polycrystalline. Growth procedures are well known and include the various ceramic processes, such as conventional ball milling and firing, freeze drying or solution drying and bulk crystal growth from fluxes such as lead oxide, lead oxide-boronoxide, lead oxide-lead-fluoride, lead oxide-boron-oxide-lead fluoride, bismuth oxide. Supported film growth, for best physical and compositional uniformity, is generally dependent upon procedures in which nucleation occurs simultaneously at many sites. Procedures which have been utilized include tipping, and immersion and extraction. Both of these procedures are flux growth procedures utilizing either a nonwetting flux containing boron oxide and lead oxide or a wetting flux containing boron oxide and bismuth oxide. To date, the most satisfactory procedure for supported growth epitaxial films is by super-cooled growth. Here, a substrate is immersed in a supersaturated solution equivalent to super-cooling of at least 50° C, and substrate, together with grown film, are extracted after a short immersion period. See, for example, 19, *Applied Physics Letters* 486 (1971).

Growth has generally been on gadolinium-gallium-garnet substrates (GGG). Growth procedures for this excellent substrate material are at a high level of development. The lattice parameter of GGG, 12.383 A, is within a range which permits either the extremely close matching desired for solely growth induced anisotropy or the still approximate matching for strain induced anisotropy. Work reported in the examples did utilize this substrate material. The substrate, however, plays no necessary active role in device performance; and any material permitting epitaxial film growth may be utilized.

The exemplary materials grown to illustrate the application of the inventive concept were grown by immersion of a gadolinium-gallium-garnet substrate in a super-cooled melt of the constituent oxides in a boron oxide-lead oxide flux. The melt composition, growth temperature and other growth conditions are selected in accordance with well recognized principles in order to produce the deposition of layers of the desired overall composition (S. L. Blank and J. W. Nielsen, *Journal of Crystal Growth* 17, 302 (1972); S. L. Blank, B. S. Hewitt, L. K. Shick and J. W. Nielsen, AIP Conference Proceedings 10, Part 1, Magnetism and Magnetic Materials, 1972, American Institute of Physics, New York 1973, p. 256). One particular melt ratio which relates to octahedral site substitution is the ratio, $R_1$, between the molar concentration of $Fe_2O_3$ and the sum of the molar concentrations of (R1) and (R2) oxides. It is known in the art that a garnet phase will be deposited if this ratio is generally, between the values 8 and 40. Below this range an orthoferrite will be deposited and above this range magnetoplumbite will be deposited. General practice dictates operation at approximately midrange (i.e., approximately 20) with no further consideration of this ratio. However, when the octahedral occupation of (R2) constituents is used to vary the temperature variation of bubble collapse field, the above mentioned ratio must be more closely considered. A direct relation has been found between the octahedral site occupancy of (R2) species and the ratio between the molar concentration of $Fe_2O_3$ and the molar concentration of the (R2) oxide. FIG. 3 shows the relation between octahedral substitution and rate of change of a bubble collapse field with temperature. Although lutetium is the most highly preferred species for control of rate of change of bubble collapse field with temperature, the use of the other octahedral site substitutions of the invention may be desirable because of other magnetic or physical considerations. The desired range of octahedral substitution $(R2)_c$ (i.e., from $c = 0.01$ to 0.2) is achieved for the range of $(R2)_a$ of $a = 0.1$ to 2.95.

EXAMPLES

1. A garnet layer of nominal composition $Y_{1.3}Sm_{.26}Lu_{.44}CaGeFe_4O_{12}$ was deposited on a substrate of gadolinium gallium garnet from a melt consisting of:

| | | |
|---|---|---|
| $La_2O_3$ | 1.188 gm | |
| $Y_2O_3$ | 1.357 gm | |
| $Sm_2O_3$ | 0.460 gm | |
| CaO | 1.899 gm | |
| $GeO_2$ | 8.844 gm | |
| $Fe_2O_3$ | 32.95 gm | |
| $B_2O_3$ | 7.45 gm | flux. |
| PbO | 371.7 gm | flux. |

Growth took place at 950° C with a 15° C supersaturation. For the above melt, the ratio $R_1 = 20$ and $R_1' = 62$. In the deposited layer $a = 0.42$ and $c = 0.027$. The film was suitable for bubble transport and stability and the collapse field varied with temperature at a rate − 0.196% per centigrade degree at room temperature. This rate of change is a good match to the temperature variation of the magnet material — barium ferrite, such as the material "Ceramic - 1" as specified by the Magnetic Materials Producers Association of Evanston, Illinois.

2. Garnet layers, for the propagation of 6μm diameter bubbles have been grown at 950° C on GGG substrates. The layers had a nominal composition $$Y_{1.48}Lu_{.29}Sm_{.27}Ca_{.96}Ge_{.96}Fe_{4.04}O_{12},$$

with $c = 0.02$. The layers exhibit an average rate of change of bubble collapse field with temperatures of approximately −0.2 percent per centigrade degree from −25° C to +50° C.

3. Garnet layers, for the propagation of 3μm diameter bubbles have been grown at 950° C on GGG substrates. The layers had a nominal composition $$Y_{1.27}Lu_{.45}Sm_{.38}Ca_{.9}Ge_{.9}Fe_{4.1}O_{12},$$

with $c = 0.027$. The layers exhibited an average rate of change of bubble collapse field with temperatures of approximately −0.2 percent per centigrade degree from 0° C to 100° C.

What is claimed is:

1. A magnetic bubble device comprising a. a substrate supporting at least a first layer of an iron containing garnet possessing an uniaxial magnetic anisotropy perpendicular to the layer, which layer is capable of supporting magnetic bubbles which are stable and of a characteristic diameter in a temperature varying bias field over a temperature range, which anisotropy is predominantly a growth induced anisotropy produced by dodecahedral site substitution, which bias field is produced by a magnet adapted for maintaining the layer in the bias field throughout the temperature range, which bias field is less than a bubble collapse field at each temperature within the temperature range, and which bias field varies throughout the temperature range at an average rate, Δ;

b. generating means for generating the bubbles; and c. propagating means for moving the bubbles in order to produce information processing characterized in that the iron garnet contains at least one member of the group consisting Lu, Yb, or Tm in octahedral sites, in a total relative molar concentration of from 0.01 to 0.2 per formula unit, such that the bubble collapse field of the garnet varies with temperature throughout the temperature range at an average rate of approximately Δ.

2. A device of claim 1 in which the composition of the first layer of iron garnet can be represented by the atomic formula:

$$(R1)_{3-(a+b)}(R2)_{a+c}(Ca,Sr)_b(Ge,Si)_bFe_{5-(b+c)}O_{12};$$

where (R1) is at least one member of the group consisting of Y, Gd, Sm or Eu; and (R2) is Lu, Yb or Tm.

3. A device of claim 2 in which $a$ is from 0.1 to 2.95 and $c$ is from 0.01 to 0.2.

4. A device of claim 3 in which (R2) is Lu.

5. A device of claim 4 in which the substrate is gadolinium gallium garnet and the composition of the first layer of the iron containing garnet can be represented by the atomic formula:

$$Y_{1.48}Lu_{.29}Sm_{.27}Ca_{.96}Ge_{.96}Fe_{4.04}O_{12};$$

where $c$ is approximately 0.02, resulting in an average rate of change of bubble collapse field of approximately −0.2 percent per centigrade degree over the temperature range from −25° C to +50° C.

6. A device of claim 5 including a magnet consisting of barium ferrite adapted for maintaining the layer in a bias field which varies with temperature at an average rate of approximately −0.2 percent per centigrade degree over the temperature range from −25° C to +50° C.

7. A device of claim 4 in which the substrate is gadolinium gallium garnet and the composition of the first layer of the iron containing garnet can be represented by the atomic formula:

$$Y_{1.27}Lu_{.45}Sm_{.38}Ca_{.9}Ge_{.9}Fe_{4.1}O_{12};$$

where $c$ is approximately 0.027, resulting in an average rate of change of bubble collapse field of approximately −0.2 percent per centigrade degree over the temperature range from 0° C to 100° C.

8. A device of claim 7 including a magnet consisting of barium ferrite adapted for maintaining the layer in a bias field which varies with temperature at an average rate of approximately −0.2 percent per centigrade degree over the temperature range from 0° C to 100° C.

* * * * *